United States Patent [19]
Gearhart

[11] Patent Number: 5,858,622
[45] Date of Patent: Jan. 12, 1999

[54] THICK METAL INTEGRATED TRANSMISSION LINE FABRICATION

[75] Inventor: Steven S. Gearhart, Madison, Wis.

[73] Assignee: Wisconsin Alumni Research Foundation, Madison, Wis.

[21] Appl. No.: 685,149

[22] Filed: Jul. 23, 1996

[51] Int. Cl.$^6$ ............................................. G03F 7/00

[52] U.S. Cl. ........................ 430/315; 430/396; 430/967; 378/34

[58] Field of Search ................................ 430/311, 313, 430/315, 319, 324, 329, 396, 967; 378/34

[56] References Cited

U.S. PATENT DOCUMENTS

| | | |
|---|---|---|
| 5,190,637 | 3/1993 | Guckel . |
| 5,206,983 | 5/1993 | Guckel et al. . |
| 5,327,033 | 7/1994 | Guckel et al. . |
| 5,378,583 | 1/1995 | Guckel et al. . |
| 5,576,147 | 11/1996 | Guckel ..................................... 430/313 |
| 5,645,977 | 7/1997 | Wu .......................................... 430/320 |

OTHER PUBLICATIONS

G.L. Matthaei, et al., Microwave Filters, Impedance–Matching Networks, and Coupling Structures, figs. 8.08–5(a), 8.09–4, 8.12–4, 9.05–1, 10.06–3 (1964).

T. H. Oxley, "Review of some microwave integrated circuit components using microstrip techniques", Radio & Electronic Engineer, vol. 48, No. 1/2, pp. 3–12, Jan./Feb. 1978.

E.W. Becker, et al., "Fabrication of microstructure with high aspect ratios and great structural heights by synchrotron radiation lithography, galvanoforming, and plastic moulding (LIGA process)",, Microelectronic Engineering, vol. 4, pp. 35–65, 1986.

F.E. Gardiol, "Design and layout of microstrip structures", IEEE Proc., vol. 135, pt. H, No. 3, pp. 145–157, Jun. 1988.

W. Ehrfeld, et al., "LIGA Process: Sensor Construction Techniques via X–Ray Lithography", Technical Digest IEEE Solid State Sensor and Actuator Workshop, pp. 1–4, 1988.

H. Guckel, et al., "Deep X–Ray and UV Lithographies for Micromechanics", Technical Digest, Solid State Sensor and Actuator Workshop, Hilton Head, S.C., Jun. 4–7, pp. 118–122, 1990.

(List continued on next page.)

*Primary Examiner*—Kathleen Duda
*Attorney, Agent, or Firm*—Foley & Lardner

[57] ABSTRACT

A method for fabricating thick metal integrated transmission lines and circuit topologies for microwave integrated circuits. Microstrip or coplanar waveguide (CPW) transmission line and circuit topologies may be fabricated on semiconductor or dielectric substrates. For microstrip transmission line topologies, a metal ground plane is applied to the opposite side of the substrate from the thick metal transmission line conductor structures. To fabricate a thick metal transmission line topology, a metal plating base is applied to a substrate surface. A photoresist layer, which may include a preformed photoresist sheet, is then applied over the plating base layer. The photoresist layer is exposed to X-rays, such as from a synchrotron, through a mask having an X-ray absorber pattern that defines the desired transmission line or circuit topology. The photoresist layer is then developed to remove sections of the photoresist layer corresponding to the mask pattern and to expose portions of the plating base layer. Thick metal transmission line circuit structures are then electroplated onto the plating base, into the wells formed by the developed photoresist layer. Transmission line thicknesses of approximately 5 $\mu$m–1 mm, may thereby be formed, having highly vertical side walls. The method may be used to fabricate various microstrip and CWT transmission line and tightly coupled circuit topologies, including couplers, low-pass and band-pass filters, and resonators.

10 Claims, 10 Drawing Sheets

OTHER PUBLICATIONS

Makoto Hirano, et al., "Folded U–Shaped Micro–Wire Technology for GaAs IC Interconnections", IEEE GaAs IC Symposium, pp. 177–180, 1992.

J. Helszajn, Microwave Planar Passive Circuits and Filters, pp. 1, 9–10, 12, 19, 33, 35–38, 94–95, 145–146, 214, 238–239, 241–242, 290, 297–298, 313–314 (1994).

Chen–Yu Chi & Gabriel M. Rebeiz, "Planar Microwave and Millimeter–Wave Lumped Elements and Coupled–Line Filters Using Micro–Machining Techniques", IEEE Trans. Microwave Theory Tech., vol. 43, No. 4, pp. 730–738, Apr. 1995.

Chen–Yu Chi & Gabriel M. Rebeiz, "A Low–Loss 20 GHz Micromachined Bandpass Filter", IEEE Trans. Microwave Theory Tech., 1995.

THICK METAL INTEGRATED TRANSMISSION LINE FABRICATION

FIELD OF THE INVENTION

This invention pertains generally to microwave integrated circuits for radar and communication systems, and more particularly to microstrip and coplanar waveguide transmission lines and circuit topologies used in such circuits and methods for fabricating such transmission lines and circuit topologies.

BACKGROUND OF THE INVENTION

The microwave integrated circuit is a miniature form of microwave circuit used in advanced microwave radar and communication systems. Microwave integrated circuit structures represent an alternative to more conventional waveguide or coaxial based microwave circuit approaches that meets the need for miniaturization required by the space and weight limitations of modern adaptive radar and communication equipment. Such equipment uses many active channels to achieve system flexibility and complex data processing capabilities. The microwave integrated circuit concept exploits the small size of solid-state devices and their compatibility with a planar form of transmission line. Microwave integrated circuits are thus able to combine the advantages of conventional integrated circuits, e.g., small size, low weight, improved reliability, and reproducability at potentially low cost, with the bandwidth performance benefits of direct integration into the microwave integrated circuit of devices with low parasitic impedance.

A planar transmission line with acceptable microwave propagation characteristics for connections between circuit elements is a necessary provision for microwave integrated circuits. One type of transmission line commonly used in microwave integrated circuits is the microstrip line. The microstrip line typically includes a strip conductor deposited onto a flat dielectric substrate, the reverse side of which is metalized to provide a ground plane. Another type of transmission line used in microwave integrated circuits is the coplanar waveguide transmission line. The coplanar waveguide line includes a center strip conductor with ground planes located on each side of and in parallel with and in the plane of the center conductor strip. Other forms of microwave transmission lines used in microwave integrated circuits include the slot line, the fin-line, and variations of the microstrip line. The planar microstrip, coplanar waveguide, and other microwave transmission lines, are also ideally suited for the realization of printed circuit topologies such as filters, directional couplers, planar resonators, and other quite complicated circuit topologies.

Planar microwave transmission line circuit topologies, such as microstrip and coplanar waveguide transmission line circuit topologies, are fabricated using either a thin-film or thick-film process. Either process may be used to form metal transmission line circuit topologies on a substrate. Typical substrates can be of an inorganic, (e.g., ceramic), synthetic, semiconductor, or ferrite material.

The thin-film fabrication process may be implemented by what is called a liftoff process, or by a process which utilizes metallization, patterning, and metal etching. In the thin-film fabrication process, vacuum-evaporation evaporation (resistance-heating or electron-beam methods) or sputtering techniques are used to deposit a thin layer of metal on a substrate surface. Metalization of the substrate surface is usually achieved by first depositing a very thin film of chromium or nickel, to provide good adhesion, and then applying a thin film of gold or nickel by a vacuum evaporation technique. For microstrip transmission line circuit topologies, both sides of a substrate surface will be metalized, one metalized side of the substrate forming the ground plane. For coplanar waveguide transmission line circuit topologies, only one side of the substrate will be metalized. The thickness of the deposited metal is normally in the 0.1 to 10 $\mu$m range. A photoresist layer is then applied over the metalized surface upon which the transmission line circuit topology is to be formed. The photoresist is typically dipped, sprayed, or spun on to the substrate using a centrifuge. Thin and uniform photoresist layers are obtainable by spinning on the photoresist, but the technique can only be used for small substrate sizes. The photoresist must typically be cured at a high temperature after it is applied to the metalized substrate.

A photographic mask, containing the details of the circuit topology to be fabricated, is then aligned onto the substrate, on top of the photoresist. The photoresist layer is then exposed to ultraviolet rays through the mask. The UV radiation must be parallel, and the photoresist layer thin, to ensure an accurate reproduction of the circuit topology pattern. By developing in a suitable chemical, either the UV exposed part of the photoresist layer (positive photoresist) or the non-exposed part (negative photoresist) is removed, exposing unwanted portions of the metalized surface beneath. The unwanted metal is then removed from the substrate by etching (or by a liftoff process). The structure is exposed to an acid that dissolves the exposed metal, but does not affect the remaining photoresist. In this manner, the transmission line circuit topology is formed on the substrate surface. The remaining photoresist is then removed with a solvent. The remaining metallic layer, now the transmission line circuit topology structure, may be thickened by electrolytic deposition of metal, or by a protective layer (for instance, gold) deposited onto the metal to prevent oxidation. All of the steps in the thin-film fabrication procedure must be carefully separated by rinsing and cleaning operations, sometimes followed by drying in an oven. Drying is particularly critical for synthetic substrates, since some of them tend to absorb water.

The objective of the thin-film fabrication technique is to realize a circuit topology having a pattern as similar as possible to the structure defined by the photographic mask. However, during the etching process, the acid does not remove the metal uniformly, but yields a trapezoidal cross-section instead of the rectangular one desired. This phenomenon of under-etching also takes place in the metal deposition process. Under-etching becomes more significant for thicker metal layers; hence, the thin-film fabrication process is only typically used to fabricate thin transmission line conductors and circuit topologies. As a result, the power handling capability of transmission line circuit topologies fabricated using the thin-film method are limited.

The thick-film fabrication technique is used to fabricate planar transmission line structures, resistors, and capacitors. Typical metals used in the thick-film processing technology may include silver, gold, palladium-gold, platinum-gold, and silver-palladium. The thick-film fabrication technique employs a screen that is covered with a photosensitive emulsion. The screen and emulsion are exposed to radiation in a pattern, and the emulsion developed, to form an image of the required transmission line circuit topology structure on the screen. The metal is applied to the substrate by spreading a paste containing the metal and a binder (typically glass beads or particles) through the screen and onto the substrate. The developed emulsion on the screen prevents the paste from passing through the screen in certain areas. Thus, the desired transmission line circuit topology structure is formed on the substrate in the desired pattern. The film of metal paste is then fired at a high temperature (about 800° C.) to drive off the glass binder.

The thick-film fabrication technique normally results in a line resolution of about 100 μm, which is difficult or impossible to use with coupled transmission line topologies requiring spacings of less than 100 μm, narrow high-impedance transmission lines, or precisely defined circuit elements. In addition, the conductivity of thick-film fabricated conductors tends to be considerably less than the conductivity of similar bulk materials, and this can lead to problems of high transmitted-power loss at microwave frequencies. The thick-film fabrication approach is thus usually not accurate enough for microwave circuits, but is used to realize components like resistors or capacitors. This fact generally leads to a preference for the thin-film fabrication technology for microwave integrated circuit applications.

Deep X-ray lithography involves a substrate which is covered by a thick photoresist, typically several to several hundred microns in thickness, that is exposed through a mask by X-rays. X-ray photons are much more energetic than optical photons, which makes complete exposure of photoresist films feasible and practical. Furthermore, since X-ray photons are short wavelength particles, diffraction effects which typically limit device dimensions to two or three wavelengths of the exposing radiation are absent for mask dimensions above 0.1 μm. If one adds to this the fact that X-ray photons are absorbed by atomic processes, standing wave problems, which typically limit exposure of thick photoresists by optical means, become a non-issue for X-ray exposures. The use of a synchrotron for the X-ray source yields high flux densities, several watts per square centimeter, combined with excellent collimation to produce thick photoresist exposures without any horizontal run-out. Locally exposed patterns should therefore produce vertical photoresist walls if a developing system with very high selectivity between exposed and unexposed photoresist is available. This requirement has been satisfied using polymethylmethacrylate (PMMA) as the X-ray photoresist, and an aqueous developing system. See, H. Guckel, et al., "Deep X-ray and UV Lithographies for Micromechanics," Technical Digest, Solid State Sensor and Actuator Workshop, Hilton Head, S.C., June 4–7, 1990, pp. 118–122.

Deep X-ray lithography may be combined with electroplating to form high aspect ratio structures. To do so requires that the substrate be furnished with a suitable plating base prior to photoresist application. Commonly, this involves a sputtered film of adhesive metal, such as chromium or titanium, which is followed by a thin film of metal which is suitable for electroplating the metal to be plated. In appropriate cases, the use of an initial layer of adhesive metal is not necessary. Exposure through a suitable mask and development are followed by electroplating. This process results, after clean-up, in fully attached metal structures with very high aspect ratios. Such structures were reported by W. Ehrfeld and co-workers at the Institute for Nuclear Physics (KFK) at Karlsruhe in West Germany. Ehrfeld termed the process "LIGA" based on the first letters of the German words for lithography and electroplating. A general review of the LIGA process is given in the article by W. Ehrfeld, et al., "LIGA Process: Sensor Construction Techniques Via X-Ray Lithography," Technical Digest IEEE Solid State Sensor and Actuator Workshop, 1988, pp. 1–4.

SUMMARY OF THE INVENTION

In accordance with the present invention, thick metal integrated transmission line circuit topologies are fabricated using the LIGA fabrication technique. Application of the LIGA fabrication process to the production of microwave integrated circuit topologies allows microstrip and coplanar waveguide transmission line circuits to be formed that are much thicker than is possible with conventional thin-film fabrication techniques. The resulting thick metal transmission line circuit topologies enable the development of high-power microwave integrated circuits, due to the increased quantity of metal in the transmission line circuits available for heat conduction. Use of the LIGA fabrication technique to form microwave integrated circuit topologies allows thick metal integrated transmission line circuits to be formed much more accurately than is possible with conventional thick-film fabrication techniques. Thus, the transmission line circuit topology fabrication technique of the present invention may be used to fabricate thick metal transmission line circuit topologies having closely spaced thick metal conductors. Due to the high coupling levels that are possible between two closely spaced, tall conductors, integrated transmission line circuit topologies fabricated in accordance with the method of the present invention may include coupling and filter circuit structures that may not be reliably fabricated using any other method. The thick metal transmission line fabrication process of the present invention is also compatible with semi-conductor fabrication processes. Therefore, transmission line circuit topologies fabricated in accordance with the present invention may be easily integrated with active semiconductor circuits.

Formation of a thick metal integrated transmission line circuit topology in accordance with the present invention begins with the deposition of a metal plating base layer into the surface of a substrate. Various dielectric or semiconductor materials may be used for the substrate. For microstrip transmission line circuit topologies, a second surface of the substrate is also metalized, in a conventional manner using vacuum-evaporation or sputtering techniques, to form a ground plane. A thick layer of photoresist, such as PMMA, is applied over the plating base layer. The photoresist layer may be applied in a conventional manner, such as by spinning on a liquid photoresist and then baking the photoresist until it hardens, or by applying a pre-formed photoresist sheet to the plating base layer. The photoresist layer is exposed through an X-ray mask to X-rays from a radiation source, such as synchrotron. The X-ray mask includes an X-ray absorbing pattern that defines the integrated transmission line circuit topology to be fabricated. The photoresist layer is then developed, removing selected portions thereof, and exposing the plating base layer in the desired transmission line circuit topology pattern. A thick layer of metal, e.g., nickel, gold, copper, etc., is then electroplated onto the plating base layer in the areas from which the photoresist has been removed. The remaining photoresist and plating base layer may then be removed from the substrate, leaving the electrically isolated plated thick metal transmission line circuit structure.

Integrated transmission line circuit topologies between approximately 5 μm and 1 mm thick may be fabricated using the method of the present invention. Thicker transmission line circuit topologies make higher power microwave integrated circuits possible. The electroplated metal structures conform to the shape of the mold formed by the developed photoresist layer. The use of X-ray radiation to expose the photoresist layer results in structures having highly vertical side walls. The fabrication technique of the present invention may thus be used to fabricate circuit topologies with closely spaced thick metal transmission line structures. Since the side walls of these transmission line structures are highly vertical, and surface roughness of the sidewalls is minimal, highly coupled transmission line circuit topologies may be fabricated. Various transmission line circuit topologies may be fabricated in accordance with the present invention. Examples of such topologies include low-pass and band-pass filters, microstrip resonators, interdigital capacitors, coupled-line couplers, etc. Virtually any known transmission line circuit structure or topology fabricated using conventional thin-film and thick-film fabrication techniques may be fabricated using the method of the present invention. Both microstrip and coplanar waveguide transmission line topologies may be fabricated using the method of the present invention. For microstrip topologies, the ground plane is formed on the opposite side of the substrate wafer to that of the transmission line circuit structures. For coplanar waveguide topologies, the ground plane is formed on either side of the conductors in the plane of the transmission line circuit topology conductors. These ground planes may be formed, along with the conductors, using the method of the present invention.

The fabrication process of the present invention is compatible with other integrated circuit and semiconductor fabrication processes. Thus, it is possible to fabricate active devices on a semiconductor substrate and then apply thick metal integrated transmission line structures using the fabrication method of the present invention. The fabrication method of the present invention may be used to form thick metal integrated transmission lines on the same substrate as thin planar transmission lines formed using traditional thin-film fabrication techniques. The thick metal transmission lines fabricated in accordance with the present invention may include a tapered transition between the thin planar and thick metal transmission lines to maintain a constant characteristic impedance across the transition.

Exemplary uses of the thick metal transmission line circuit topologies fabricated in accordance with the method of the present invention include use in power distribution networks, to link high power tubes to planar active circuits on semiconductor substrates. Thick metal transmission lines will also be very useful for high-power transmission lines, couplers, and filters for use in satellite communications systems.

Further objects, features, and advantages of the invention will be apparent from the following detailed description when taken in conjunction with the accompanying drawings.

DETAILED DESCRIPTION OF THE INVENTION

A method for fabricating thick metal integrated transmission line circuit topology structures in accordance with the present invention is described with reference to FIGS. 1–6. In accordance with the present invention, a LIGA type fabrication technique is used to fabricate metal transmission line structures which may be several to several hundred micrometers thick. More detailed exemplary descriptions of the LIGA fabrication technique in general may be found in U.S. Pat. No. 5,190,637, to Guckel, entitled "Formation of Microstructures by Multiple Level Deep X-ray Lithography with Sacrificial Metal Layers", U.S. Pat. No. 5,206,983, to Guckel, et al., entitled "Method of Manufacturing Micromechanical Devices", and U.S. Pat. No. 5,327,033, to Guckel, et al., entitled "Micromechanical Magnetic Devices", the disclosures of which are incorporated herein by reference.

Figure 1:
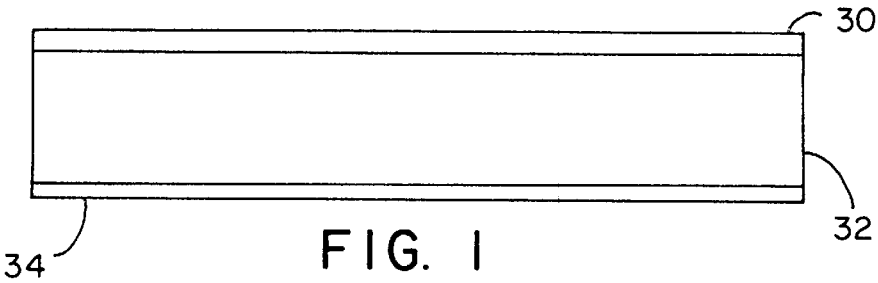
FIG. 1 is a simplified illustrative side view of a substrate with a metal ground plane layer and a metal plating base layer formed thereon.

As illustrated in FIG. 1, the fabrication method of the present invention begins with the application of a metal plating base layer 30 onto a surface of a substrate 32. The plating base layer 30 preferably includes a sputtered film of adhesive metal, such as chromium or titanium, followed by a thin film of the metal that is to be plated. Various dielectric or semiconductor materials may preferably be used for the substrate 32. Depending upon the final application of the thick metal transmission line circuit topologies to be formed, ceramic, synthetic, semiconductor, or ferrite substrates may be used. An exemplary substrate wafer 32 may be made of fused-quartz. This type of substrate is particularly useful for high power applications because it dissipates heat well. Semiconductor substrates, such as of gallium arsenide (GaAs) do not dissipate heat as well.

For the fabrication of microstrip transmission line circuit topology structures, a metal ground plane 34 is applied to a second surface of the substrate 32, opposite that of the plating base layer 30. The ground plane layer 34 may be made of a variety of conducting metals, such as nickel, gold, or copper. The ground plane layer 34 may be deposited in a conventional manner, using vacuum-evaporation or sputtering techniques. The ground plane layer 34 may also be applied in multiple layers. For example, a two-layer ground plane 34 may include a thin vacuum deposited layer of chromium or nickel chromium, to provide good adhesion to the substrate 32, followed by a similarly deposited layer of gold or copper of similar thickness, with the top layer increased in thickness by electro-plating. The thickness of the ground plane layer 34 is preferably in the 2 to 10 $\mu$m range.

Figure 2:
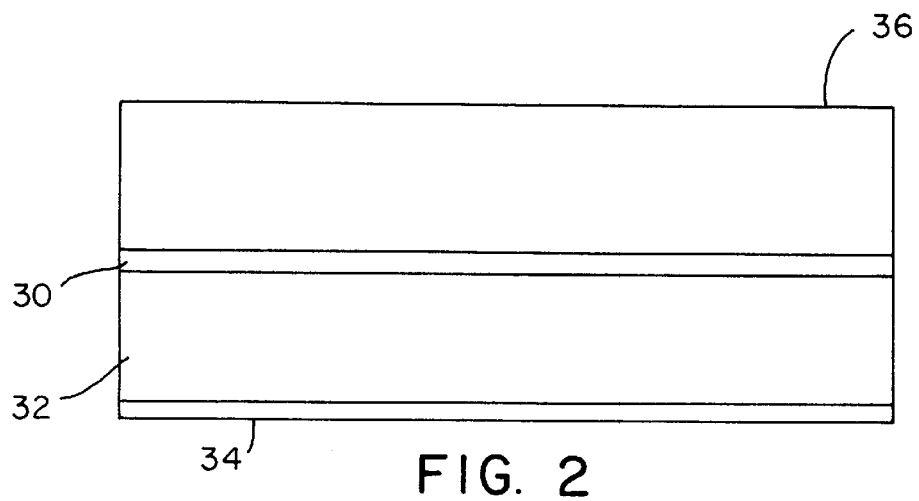
FIG. 2 is a view of the substrate of FIG. 1 with a photoresist layer applied to the plating base layer.

A thick photoresist layer 36 is then applied on top of the plating base layer 30, as illustrated in FIG. 2. The photoresist 36 is a material that can be exposed to X-ray radiation to affect its susceptibility to a developer. A preferred photoresist material is polymethylmethacrylate (PMMA). The photoresist layer 36 must be at least as thick as the desired thickness of the thick metal transmission line circuit topology structures to be formed. The photoresist layer 36 may be applied using traditional methods, such as by spinning a liquid photoresist material onto the plating base 30, and then heating the photoresist to produce a solid photoresist layer 36. For thinner transmission line structures, e.g., approximately 5–10 $\mu$m in thickness, this method of applying the photoresist layer 36 is preferred. For thicker photoresist layers 36, however, the heating cycles can cause strain in the photoresist film due to a significant mismatch in thermal expansion coefficients between the PMMA photoresist 36 and the substrate 32. Internal strain in the photoresist 36 also occurs due to the shrinking of the photoresist film during curing. This internal strain can result in undesirable distortion of the side-walls formed in the photoresist layer 36 after patterning of the photoresist layer 36 by X-ray exposure and development. Therefore, for the formation of thick metal transmission line circuit topology structures, the use of a preformed photoresist sheet to form the photoresist layer 36 is preferred. The preformed photoresist sheet 36 may be solvent bonded to the plating base layer 30. The use of preformed photoresist sheets in the LIGA fabrication process in general is described in more detail in U.S. Pat. No. 5,378,583, to Guckel, et al., entitled "Formation of Microstructures Using a Preformed Photoresist Sheet", the disclosure of which is incorporated herein by reference.

Figure 3:
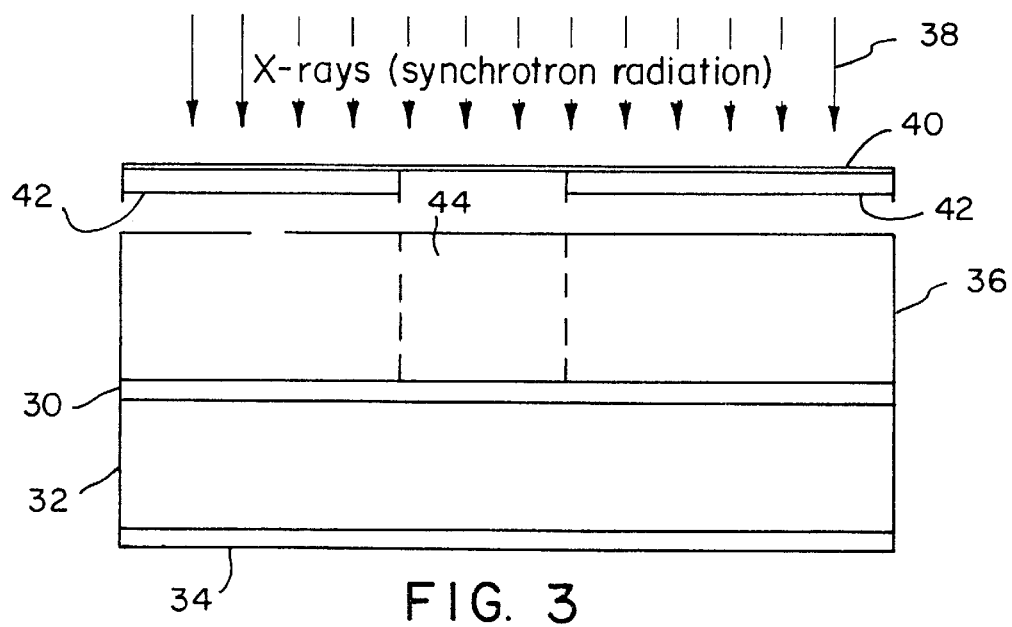
FIG. 3 is an illustrative view showing the photoresist and substrate of FIG. 2 exposed through an X-ray mask to X-ray radiation.

After the photoresist layer 36 has been applied to the plating base layer 36, it is patterned using X-ray radiation 38 and an X-ray mask 40, as illustrated in FIG. 3. Use of X-rays 38 makes complete exposure of thick photoresist films feasible and practical. The use of a synchrotron source for the X-rays is preferred, since synchrotron X-rays yield high flux densities, combined with excellent collimation to produce thick photoresist exposures without any horizontal run-out. This makes possible the fabrication of thick metal transmission line circuit topology structures having highly vertical sidewalls. The X-ray mask 40 has X-ray absorbers 42 formed thereon in a pattern. The X-ray absorbers 42 prevent the transmission of X-rays 38 through the mask 40 and onto the photoresist layer 36. The X-ray absorbers 42 are formed on the X-ray mask 40 in a pattern that defines the thick metal transmission line circuit topology to be fabricated. As will be discussed in more detail below, the X-ray mask pattern may be designed to fabricate thick metal microstrip or coplanar waveguide transmission lines and circuit topologies including filters, resonators, interdigital capacitors, coupled-line couplers, etc. The X-ray mask absorber pattern allows only a portion 44 of the photoresist layer 36 to be exposed to the X-ray radiation 38. This exposed portion 44 corresponds to the thick metal transmission line circuit topology structure to be fabricated. Note that the use of a positive type photoresist is illustrated in FIG. 3. For negative type photoresists, exposure to radiation causes the photoresist to be made not susceptible to removal by a developer. For a negative photoresist layer 36, therefore, the X-ray mask absorber pattern is the negative of the mask pattern for a positive photoresist.

Figure 4:
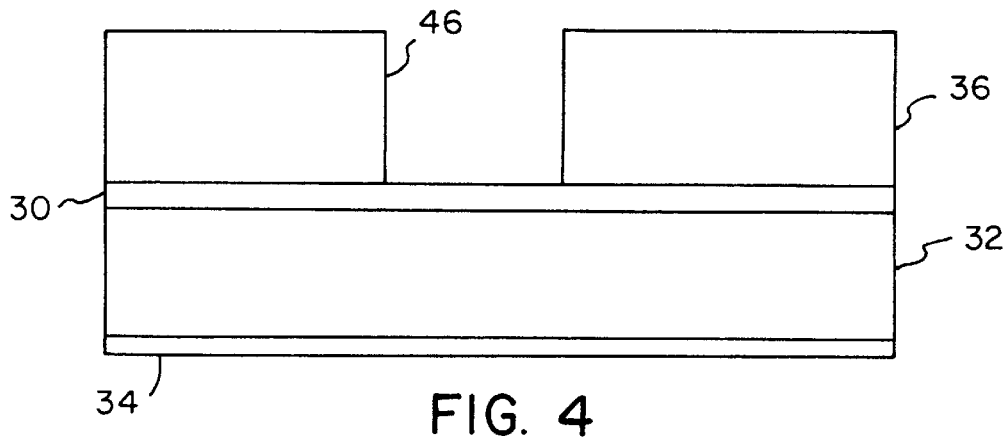
FIG. 4 is an illustrative view showing the substrate and photoresist of FIG. 3 after the exposed photoresist has been developed.

The exposed photoresist layer 36 is then developed to remove the exposed portion 44 of the photoresist layer 36. As illustrated in FIG. 4, the development process results in a well in the photoresist layer 36 having vertical sidewalls 46 and exposing the plating base layer 30 in the area from which the photoresist layer is removed. The plating base layer 30 is thus exposed in the pattern of the thick metal transmission line circuit topology to be fabricated. Note that if a preformed photoresist sheet is used to form the photoresist layer 36, the photoresist sheet may be exposed to radiation in a pattern, and even developed, before being bonded to the plating base layer 30.

Figure 5:
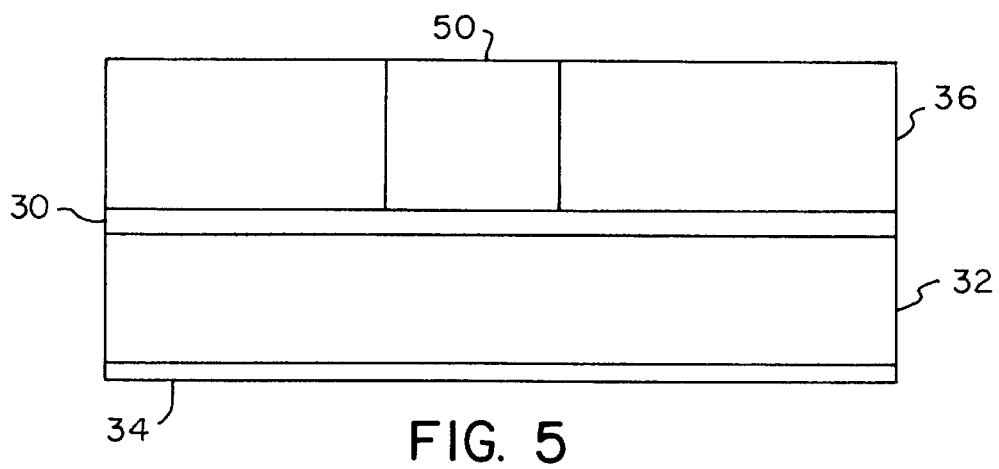
FIG. 5 is an illustrative view showing the substrate and photoresist of FIG. 4 after a thick metal transmission line structure has been electroplated onto the plating base and into the mold formed by the removed portion of the photoresist layer.

As illustrated in FIG. 5, a thick metal integrated transmission line structure 50 is then electroplated into the photoresist well and onto the exposed portion of the plating base 30. The thick metal integrated transmission line circuit structure 50 may be formed of a variety of conducting metals, including nickel, gold, or copper. It is generally not necessary to planarize or smooth the surface of the electroplated transmission line structure 50. Generally, much more than sufficiently smooth surfaces may be obtained using an electroplating process that is carefully controlled in a conventional manner.

Having formed the thick metal integrated transmission line structure 50, the remaining photoresist layer 36 may be removed. Where the photoresist 36 is formed of non-cross-linked PMMA, removal can take place by utilizing a solvent which dissolves the non-cross-linked PMMA. Where a cross-linked PMMA sheet is utilized, an additional blanket exposure to X-rays is required before the photoresist is removed. The portion of the metal plating base layer 30 that is not below the electroplated thick metal integrated transmission line structure 50 is then also etched away, to leave an electrically isolated thick metal integrated transmission line structure 50 on the substrate 32, as illustrated in FIG. 6.

As an alternative to removing the photoresist layer 36, the photoresist may be exposed and developed a second time in a different pattern. A second thick metal transmission line circuit topology may then be electroplated onto the plating base in the manner described. This process may be repeated several times. Each time, the duration of the electroplating process may be changed. Thus, thick metal transmission line circuit topologies of different metal thicknesses may be formed in the same circuit.

Figure 6:
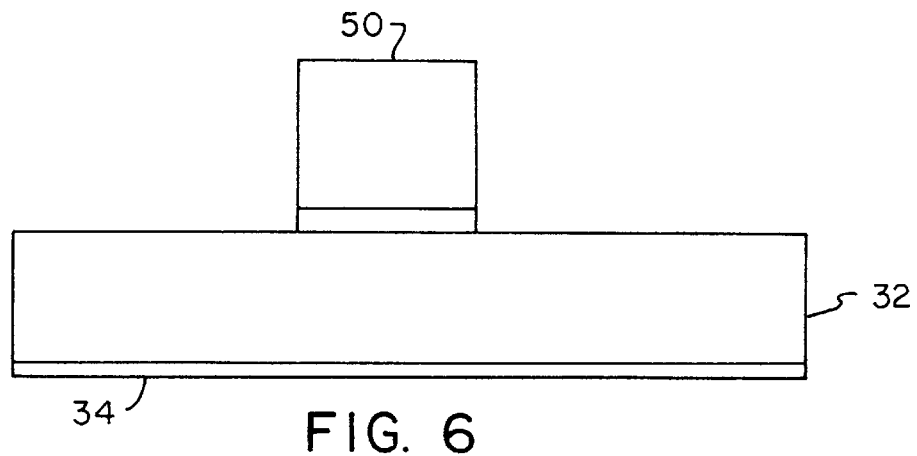
FIG. 6 is an illustrative view showing the substrate and electroplated thick metal transmission line structure of FIG. 5 after the excess photoresist and plating base layer has been removed.
Figure 7:
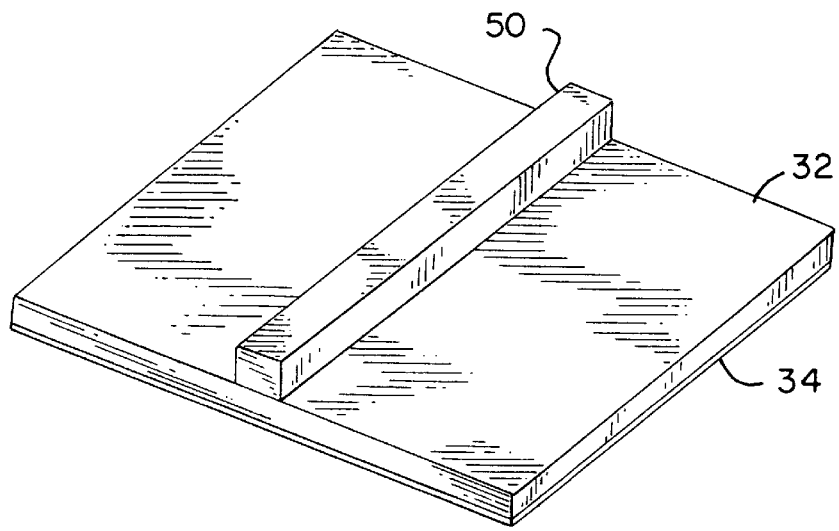
FIG. 7 is a simplified illustrative perspective view of a thick metal microstrip transmission line fabricated in accordance with the method of the present invention.
Figure 8:
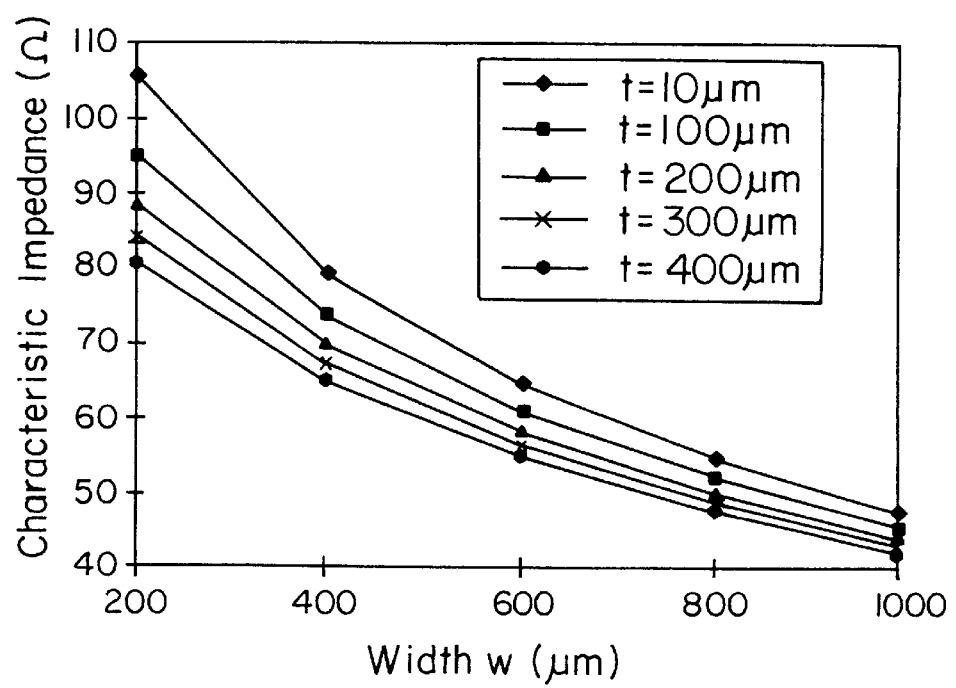
FIG. 8 is a graph illustrating the characteristic impedance of a thick metal microstrip transmission line fabricated in accordance with the method of the present invention.

The resulting thick metal microstrip transmission line structure 50 of FIG. 6 is shown, in a simplified illustrative perspective view, in FIG. 7. The thickness of a metal transmission line structure fabricated in accordance with the method of the present invention may be between approximately 5 $\mu$m and 1 mm. Thick metal transmission line structures of this type are particularly useful for high power applications, because of the greater volume of metal that is available for heat conduction. Thus, the method of the present invention for fabricating thick metal transmission line structures enables the development, for example, of high-power monolithic circuits for commercial transmitter applications. A finite difference analysis of thick metal microstrip transmission lines fabricated in accordance with the method of the present invention on a 420 $\mu$m thick fused quartz substrate 32 ($e_r$=3.81 at 30 GHz) shows that a wide range of characteristic impedances may be obtained for use in microwave integrated circuits. This analysis is illustrated in FIG. 8. As expected, the characteristic impedance decreases as the thickness of the metal is increased.

Figure 9:
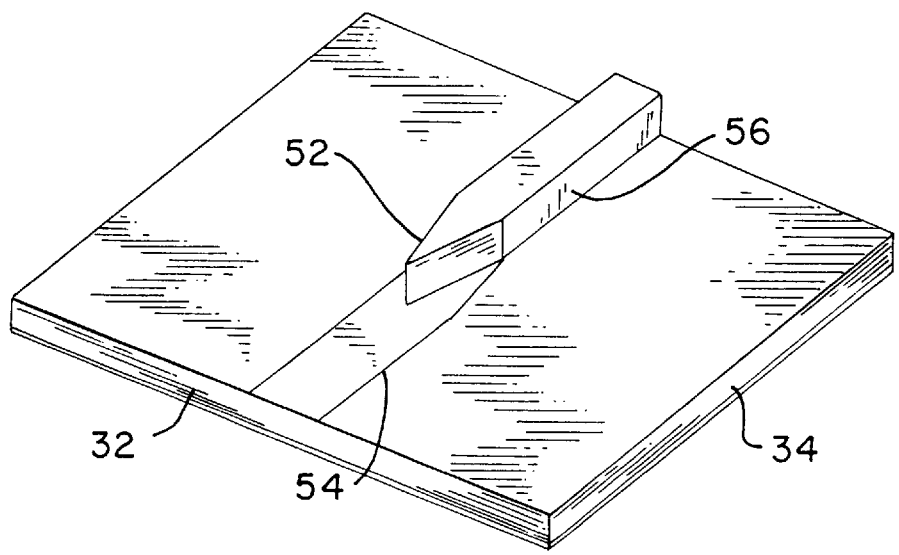
FIG. 9 is a simplified illustrative perspective view of a transition connection between a thin planar microstrip transmission line and thick metal microstrip transmission line fabricated in accordance with the method of the present invention.

Thick metal transmission lines, filters, and other circuit topology structures fabricated in accordance with the method of the present invention may be added to any substrate as a last step in the integrated circuit fabrication process, and therefore may easily be combined with active devices such as transistors and diodes. This is possible because the LIGA fabrication process is compatible with standard integrated circuit and semiconductor fabrication processes. Thick metal transmission line structures fabricated in accordance with the method of the present invention may be applied to substrates having active circuits connected by traditional thin planar microstrip lines fabricated using the thin-film fabrication technique. A preferred transition structure 52 between a conventional thin planar microstrip line 54, and a thick metal microstrip line 56 fabricated in accordance with the method of the present invention is illustrated in FIG. 9. The transition 52 is formed by gradually increasing the width of the thick metal transmission line 56, while gradually decreasing the width of the thin planar transmission line 54 underneath it, so that the characteristic impedance of the combination remains constant across the taper. The tapered portion 52 of the thick metal transmission line 52 may be defined by the X-ray absorber pattern, which is aligned with the planar transmission line 54.

Figure 10:
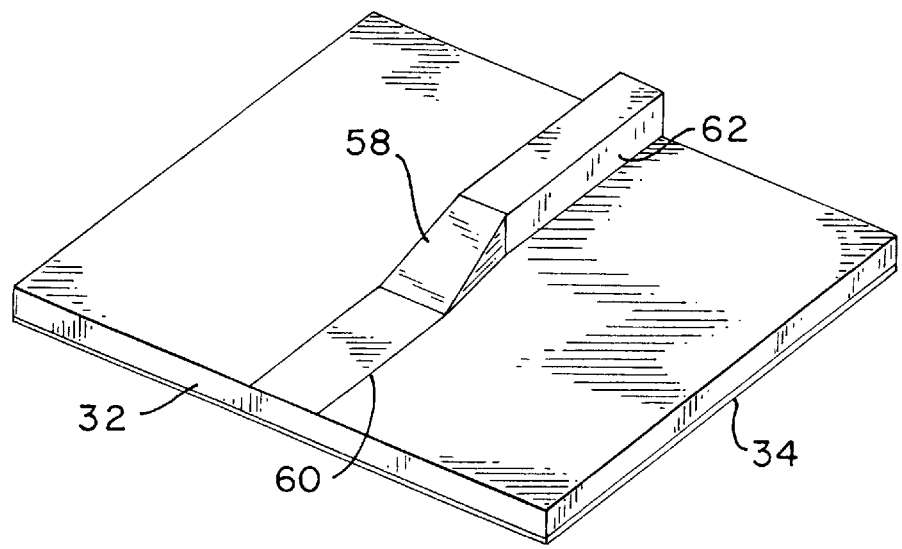
FIG. 10 is a simplified illustrative view of an alternative transition connection between a thin planar microstrip transmission line and a thick metal microstrip transmission line fabricated in accordance with the method of the present invention.

An alternative transition structure 58 between a thin planar microstrip transmission line 60 and a thick metal microstrip transmission line 62 fabricated in accordance with the method of the present invention is illustrated in FIG. 10. In this transition structure 58, both the vertical and horizontal dimensions of the thick metal transmission line structure 62 are simultaneously transitioned from those of the thin planar transmission line 60 to that of the thick metal transmission line 62. This alternative transition structure 58 is more ideal; however, it is more difficult to fabricate than the transition structure 52 illustrated in FIG. 9. The alternative microstrip transition 58 illustrated in FIG. 10 may be fabricated by tilting the substrate wafer 32 during exposure of the photoresist layer so as to achieve a taper in the vertical direction. The photoresist is thereby patterned, after developing, to have a tapered overhang or ceiling in the area of the transition 58 into which the transmission line metal is electroplated.

Note that the tapered transitions illustrated in FIGS. 9 and 10 may be applied to coplanar waveguide transmission lines as well as microstrip transmission lines. Tapered transitions may also preferably be used between thick metal transmission line structures of different thicknesses made in accordance with the method of the present invention.

Figure 11:
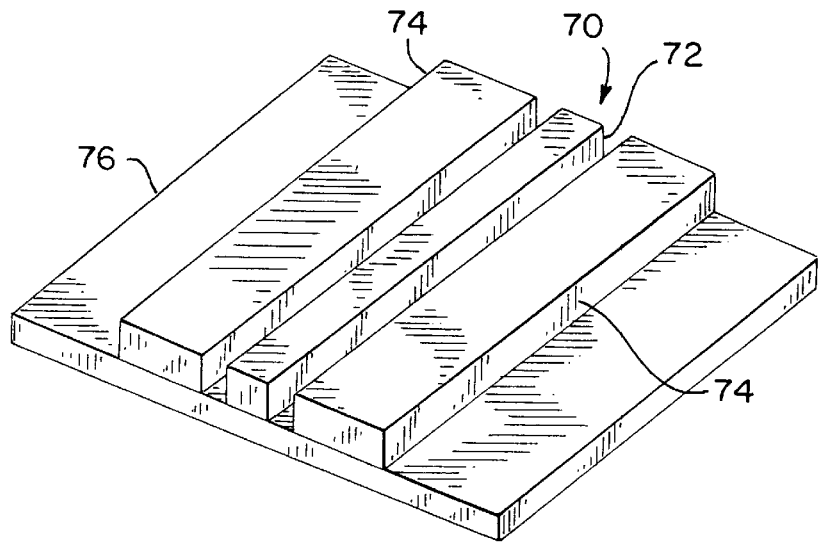
FIG. 11 is a simplified illustrative perspective view of a thick metal coplanar waveguide transmission line fabricated in accordance with the method of the present invention.

As has been previously mentioned, the fabrication method of the present invention is not limited to the fabrication of thick metal microstrip transmission line topologies. Thick metal coplanar waveguide (CPW) transmission lines 72, as illustrated, for example, in the simplified illustrative perspective view of FIG. 11, may also be fabricated using this method. The CPW transmission line 70 includes a center strip conductor 72 with ground planes 74 located on each side of and parallel to and in the plane of the center strip conductor 72. The center strip conductor 72 and ground planes 74 may be fabricated on a substrate 76 by the fabrication method of the present invention as described previously with respect to FIGS. 1–6. The CPW transmission line structure is defined by the absorber mask pattern. Use of thick metal for the CPW ground plane 74 is optional. For the CPW transmission line structure 70, the ground planes 74 are located on the same surface of the substrate 76 as the center strip conductor 72. This structure thus has the advantage that parallel or shunt connections between the transmission line conductor 72 and the ground planes 74 do not require drilling through or connecting around the edge of the substrate 76, as is required for parallel or shunt connections of the microstrip transmission line structure 50 (see FIG. 7) having a ground plane 34 on the opposite surface of the substrate 32 from the transmission line 50. However, the open microstrip structure may allow for a greater concentration of transmission line structures, and more flexibility in their positioning on the substrate 32, than is possible using the CPW transmission line structure of FIG. 11. Also, in the microstrip transmission line structure, the ground plane 34 inherently stays cool because electric fields are all generated on top of the substrate 32 where the transmission lines 50 and other circuit components exist. Although it must also be recognized that the present invention allows the fabrication of CPW transmission lines with thick metal ground planes 74. Due to the large amount of metal in such ground planes 74, a CPW transmission line fabricated in accordance with the method of the present invention should also stay cool.

The thick metal transmission line structures fabricated in accordance with the method of the present invention have highly vertical sidewalls, allowing thick metal transmission line structural elements to be placed within microns of each other. Thus, various microstrip and CPW filter, coupler, and other circuit topology structures may be fabricated using the method of the present invention. The limitation on transmission line element-to-element spacing is set by the angle of the metal sidewall. For the fabrication method of the present invention, at worst case, a 1 $\mu$m variation in the lateral direction for each 100 $\mu$m of height may be expected. This corresponds to less than a 0.6 degree angular variation from the vertical. Even with this maximum variation from vertical, 200 $\mu$m-tall conductors may be placed with 5 $\mu$m of each other. For thinner transmission line structures, such as very high frequency (94 GHz) couplers that are fabricated to a thickness of approximately 5 µm, the fabrication process of the present invention may be used to achieve gap spacings of less than 2 µm.

Figure 12:
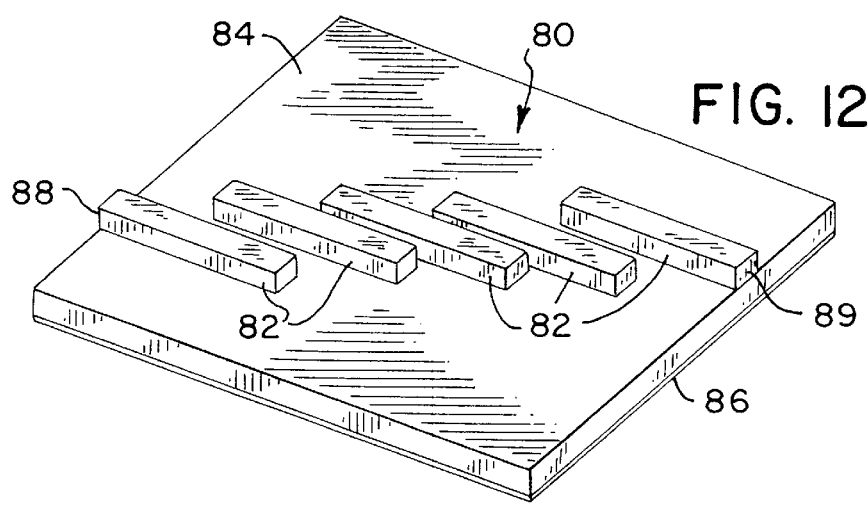
FIG. 12 is a simplified illustrative perspective view of a thick metal microstrip transmission line band-pass filter topology fabricated in accordance with the method of the present invention.
Figure 13:
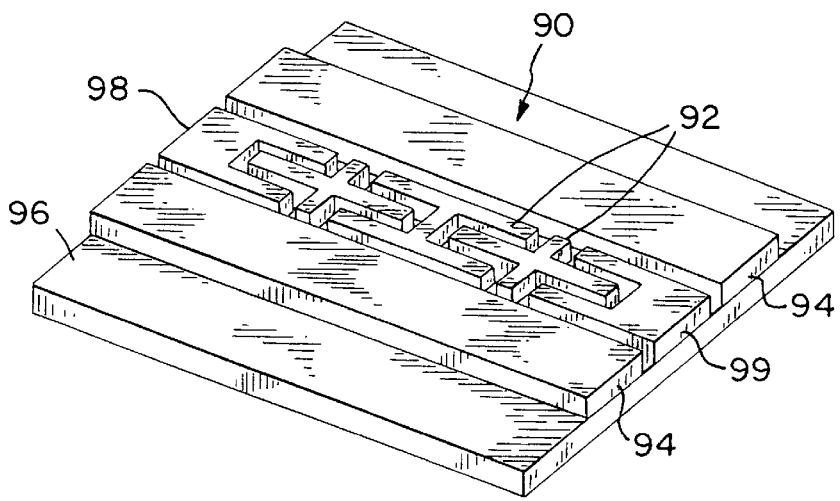
FIG. 13 is a simplified illustrative perspective view of a coplanar waveguide transmission line band-pass filter topology fabricated in accordance with the method of the present invention.

An exemplary thick metal microstrip topology band-pass filter circuit 80, that may be fabricated in accordance with the method of the present invention, is illustrated in FIG. 12. As shown, multiple thick metal microstrip transmission line sections 82, separated by gaps, are fabricated on a substrate 84 having a ground plane 86. A first thick metal microstrip section 88 may be the input to the band-pass filter structure 80, with a second thick metal microstrip section 89 being the output of the band-pass filter 80. A CPW topology thick metal band-pass filter 90, as illustrated in FIG. 13, may also be fabricated using the method of the present invention. The CPW band-pass filter 90 includes several thick metal center conductor sections 92, separated by gaps, between two ground plane conductors 94, with both center conductor sections 92 and ground planes 94 fabricated on a substrate 96. A first of the center conductor sections 98 may be an input to the band-pass filter 90, with a second of the center conductor sections 99 being the output of the bandpass filter 90. Note that either the microstrip topology or CPW topology band-pass filters illustrated in FIGS. 12 and 13 may be fabricated using the method of the present invention, as described previously with reference to FIGS. 1–6. For each case, the X-ray mask absorber pattern defines the filter topology pattern to be formed. Since the band-pass filter topologies may be fabricated in accordance with the method of the present invention to be much thicker than is possible with prior microstrip and CPW fabrication techniques, microwave integrated circuit filters having much higher power handling capability than was previously possible may be fabricated.

Figure 14:
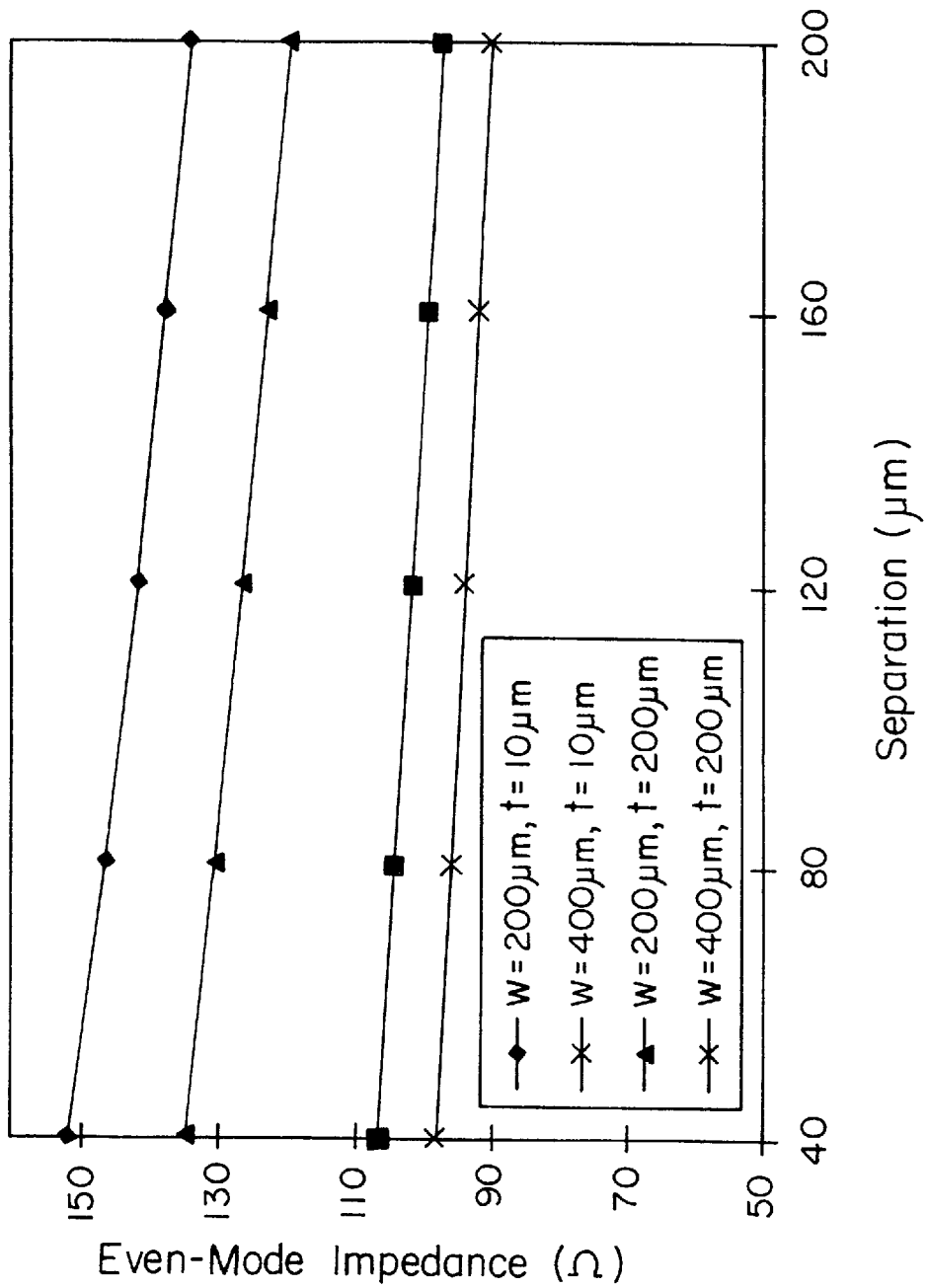
FIGS. 14 and 15 are graphs illustrating even and odd mode impedances of coupled thick metal microstrip transmission lines fabricated in accordance with the method of the present invention.
Figure 15:
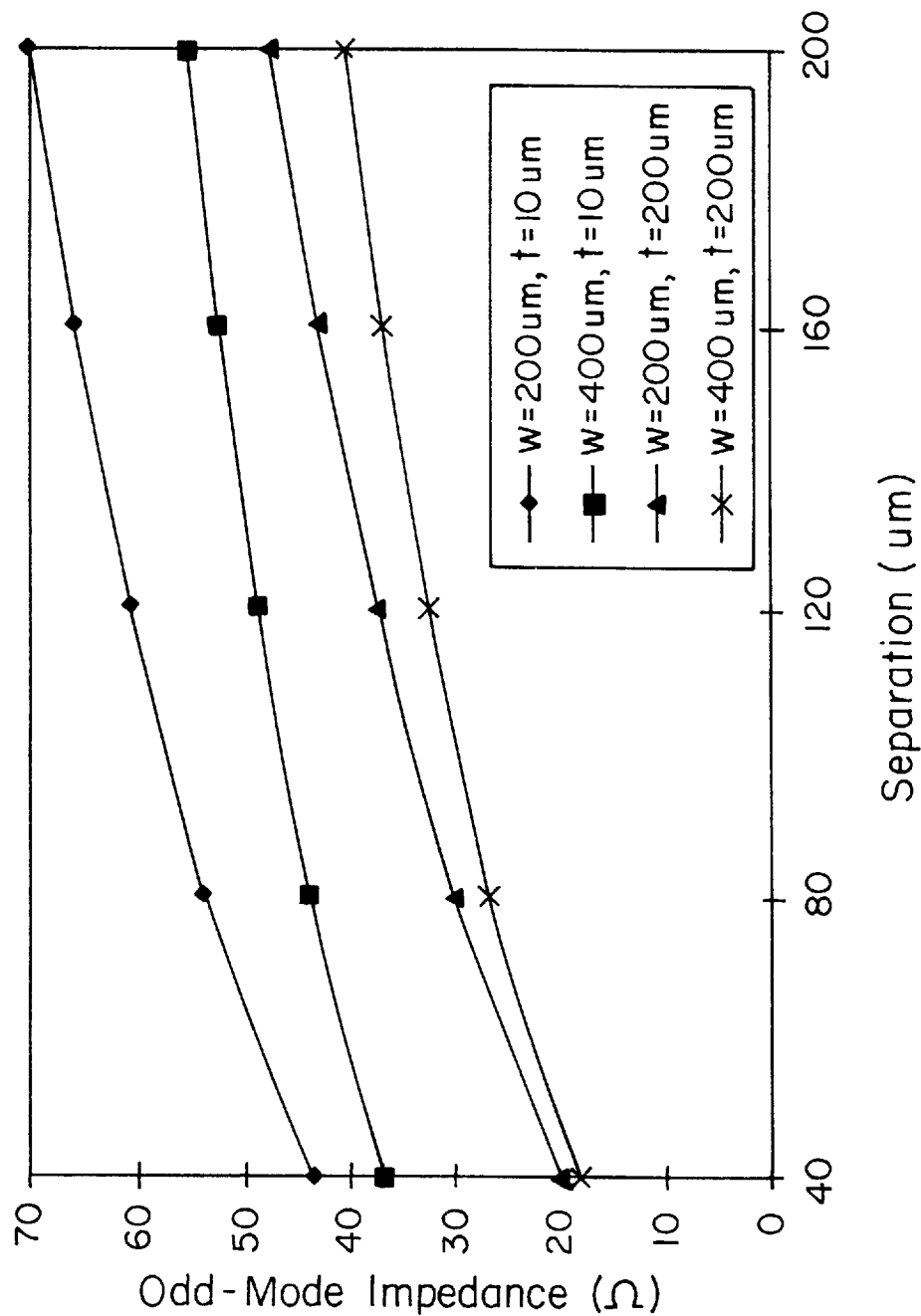

Due to the potentially high capacitance between tall, closely spaced, adjacent transmission lines, thick metal microstrip and CPW transmission line structures fabricated in accordance with the method of the present invention are ideal for couplers and filters of many types and designs. For example, a thick metal microstrip coupler may be made by fabricating two closely spaced thick metal transmission lines in accordance with the method of the present invention. A finite difference analysis of such a vertical sidewall thick metal microstrip coupled-line structure has been performed. The results of this analysis for microstrip transmission line thicknesses of 10 and 200 µm on a 420 µm thick fused quartz substrate are presented in FIGS. 14 and 15. FIG. 15 illustrates that the odd-mode characteristic impedance is primarily controlled by metal thickness, while FIG. 14 shows that even-mode impedance is dominated by the total transmission line width. Since multiple X-ray exposures will allow different metal thicknesses and widths within the same circuit, the fabrication process of the present invention allows nearly independent control over the even and odd-mode characteristic impedances of thick metal coupled microstrip lines fabricated in accordance with the method of the present invention.

Figure 16:
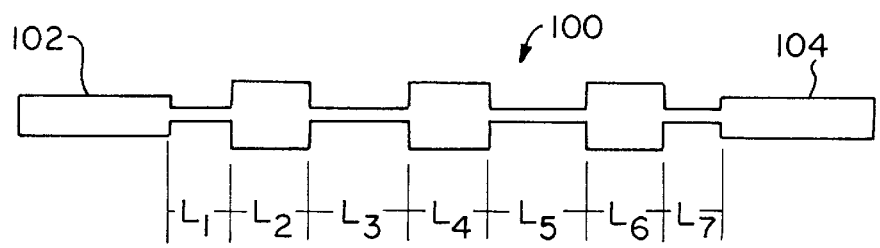
FIG. 16 is a schematic illustration of a thick metal microstrip transmission line low-pass filter topology design fabricated in accordance with the method of the present invention.

FIG. 16 illustrates a 10 GHz microstrip topology low-pass filter design 100 that may be fabricated in accordance with the method of the present invention. The microstrip topology low-pass filter 100 is designed for fabrication on a 420 µm-thick fused quart substrate. The preferred metal thickness of the low-pass filter 100 is 200 µm. The input and output lines 102 and 104 to the low-pass filter 100 are 800 µm wide, corresponding to a 50 Ω characteristic impedance. The low-pass filter design 100 includes seven thick metal conductor sections $L_1$–$L_7$ of alternating wide and narrow widths. Sections $L_1$ and $L_7$ are 100 µm wide and 2520 µm long, having a characteristic impedance of 106 Ω. Sections $L_2$ and $L_6$ are 1500 µm wide and 2700 µm long, having 35 Ω characteristic impedance. Sections $L_3$ and $L_5$ are 100 µm wide and 3825 µm long, with a characteristic impedance of 106 Ω. Section $L_4$ is 1500 µm wide and 2885 µm long, with a characteristic impedance of 35 Ω.

Figure 17:
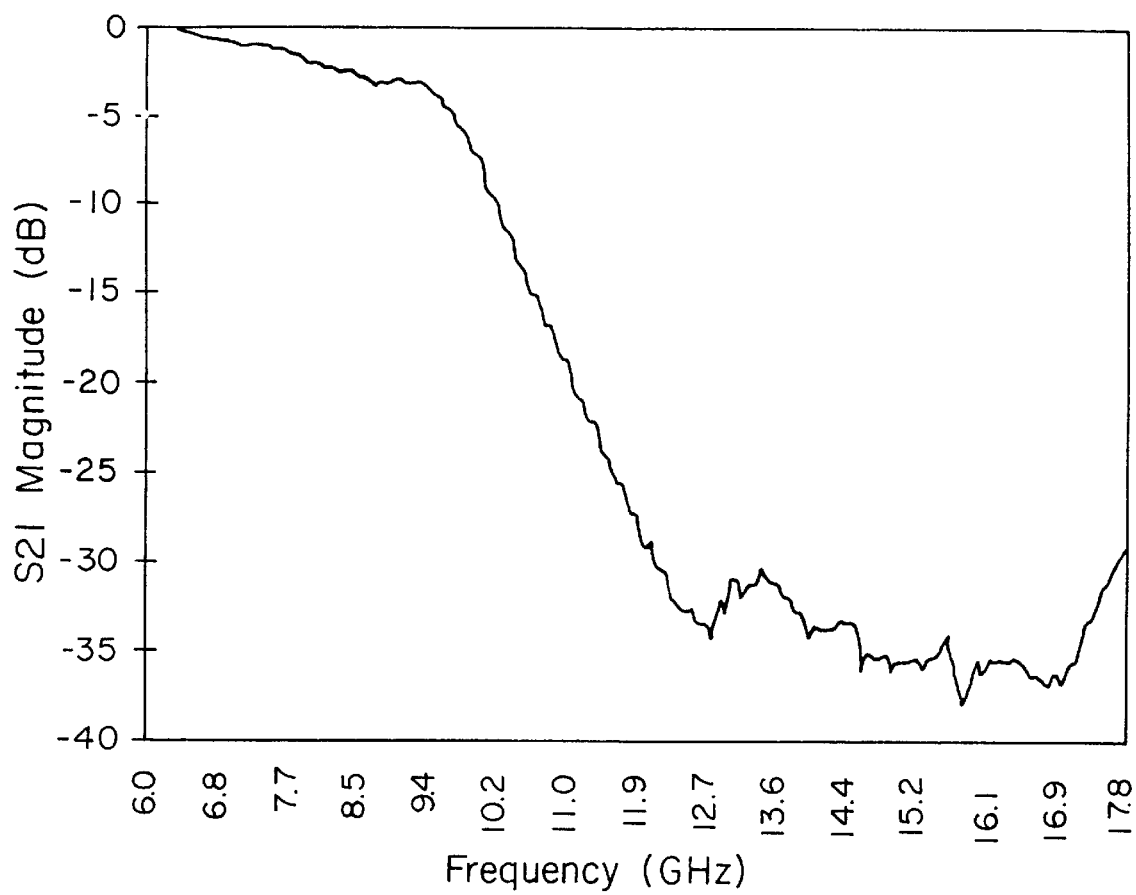
FIG. 17 is a graph of the measured filter response of the low-pass filter topology design illustrated in FIG. 16 and fabricated in accordance with the method of the present invention.

The microstrip topology low-pass filter design 100 illustrated in FIG. 16 was fabricated using the method of the present invention. The low-pass filter design 100 was fabricated by electroplating nickel onto a 420 µm thick 3 inch double-polished fused-quartz wafer to a metal thickness of 160 µm. The response of the filter 100 was then measured using an HP 8510C network analyzer with a microstrip test fixture. A Short-Open-Load-Through (SOLT) calibration was performed using coaxial HP calibration standards. The measured filtered response of the microstrip topology low-pass filter structure 100 is illustrated in FIG. 17. As shown, the 160 µm-thick low-pass microstrip filter fabricated in accordance with the method of the present invention has a measured 3 dB cutoff frequency of 9.0 GHz, and demonstrates 20 dB of attenuation at 11.1 GHz. Both results are within 6% of the theoretical values, and the differences are most likely due to the open end effects of the low-impedance transmission line sections.

Figure 18:
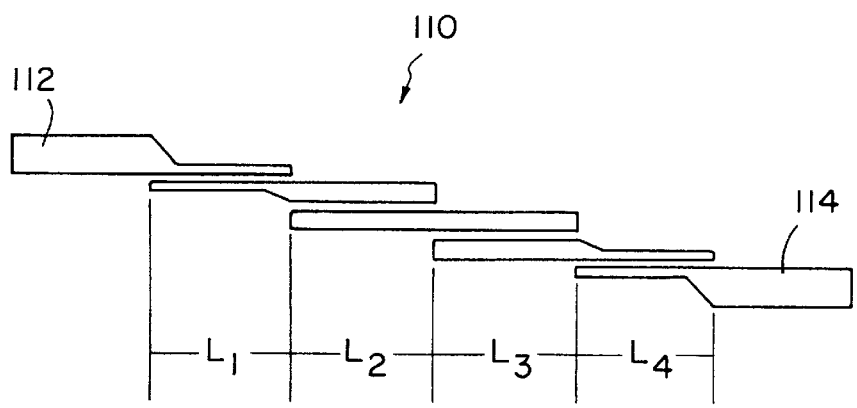
FIG. 18 is a schematic illustration of a thick metal microstrip transmission line band-pass filter topology design fabricated in accordance with the method of the present invention.

A 10 GHz microstrip topology band-pass filter design 110 that may be fabricated in accordance with the method of the present invention is illustrated in FIG. 18. The band-pass filter 110 is designed for fabrication on a 420 µm-thick fused quartz substrate. The preferred metal thickness for the band-pass filter design 110 is 200 µm. The input and output lines 112 and 118 are 800 µm wide, corresponding to a 50 Ω characteristic impedance. The microstrip topology band-pass filter design 110 includes four thick metal microstrip transmission line conductor sections, $L_1$–$L_4$. Sections $L_1$ and $L_4$ are 200 µm wide and 5063 µm long, with a gap of 160 µm between transmission line conducting sections. Even mode characteristic impedance of sections $L_1$ and $L_4$ is 123 Ω, with odd mode characteristic impedance of 43 Ω. Sections $L_2$ and $L_3$ are 400 µm wide and 4845 µm long, with a 200 µm gap between the conductor sections. Even mode characteristic impedance of sections $L_2$ and $L_3$ is 90 Ω with odd mode characteristic impedance of 41 Ω.

Figure 19:
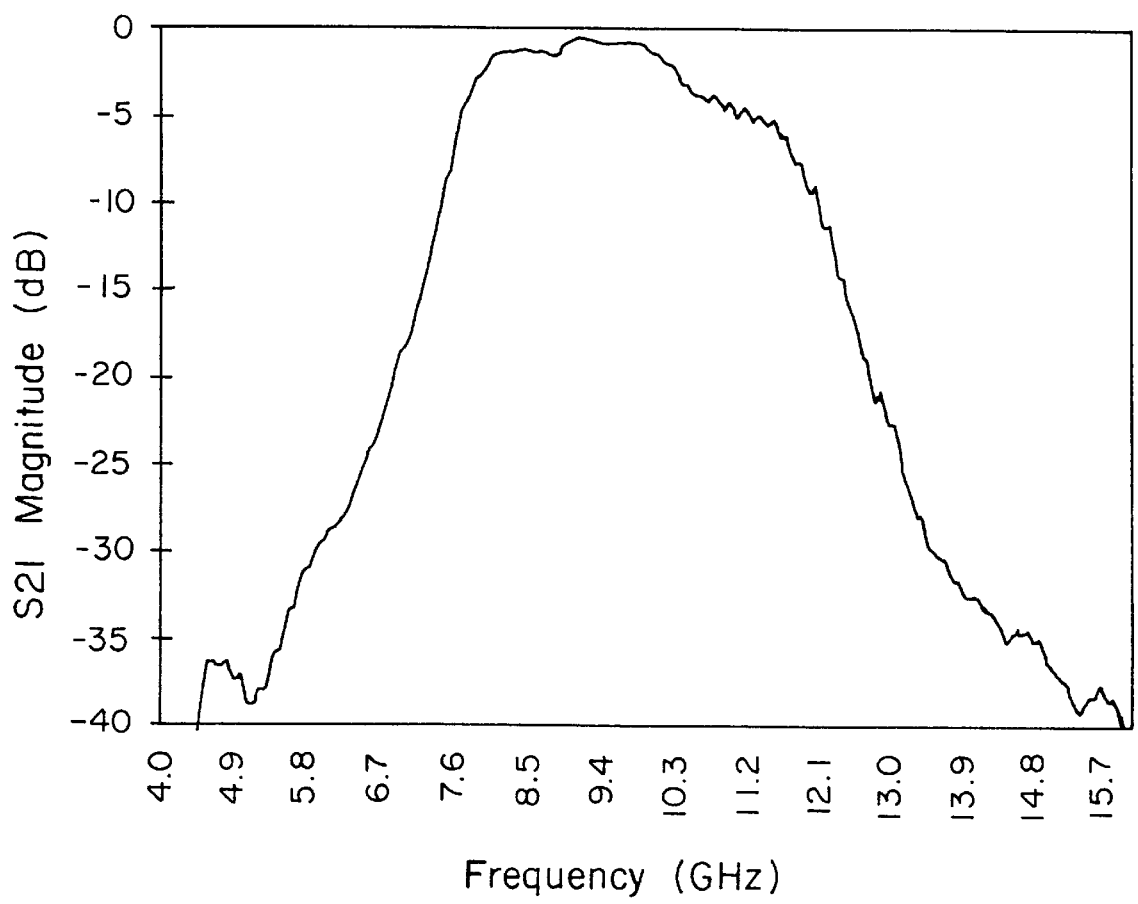
FIG. 19 is a graph of the measured filter response of the band-pass filter topology design illustrated in FIG. 18 and fabricated in accordance with the method of the present invention.

The microstrip topology band-pass filter design 110 was fabricated on a 420 µm thick 3-inch-polished fused-quartz wafer using the fabrication method of the present invention. Nickel was chosen as the conductor metal; although, of course, gold, copper, or another metal might also have been used. The metal was plated to a thickness of 120 µm. Scanning electron micrograph (SEM) pictures of the band-pass filter structure indicate that sidewall roughness is less than 0.1 µm, while top surface roughness is typically 1–5 µm. The response of the filter was measured using the same set-up as used for the filter of FIG. 16 described above. The measured filter response of the 120 µm thick microstrip band-pass filter is illustrated in FIG. 19. The band-pass filter has a minimum insertion loss of 0.4 dB at 9.1 GHz. The 3 dB cutoff frequencies of 7.8 and 10.5 GHz result in a 30% bandwidth, and the filter demonstrates 20 dB of attenuation at 6.8 and 12.8 GHz. The band-pass filter response is dependent on element-to-element coupling, and is therefore more sensitive to conductor height variations. Agreement between theoretical and experimental response is quite good.

Figure 20:
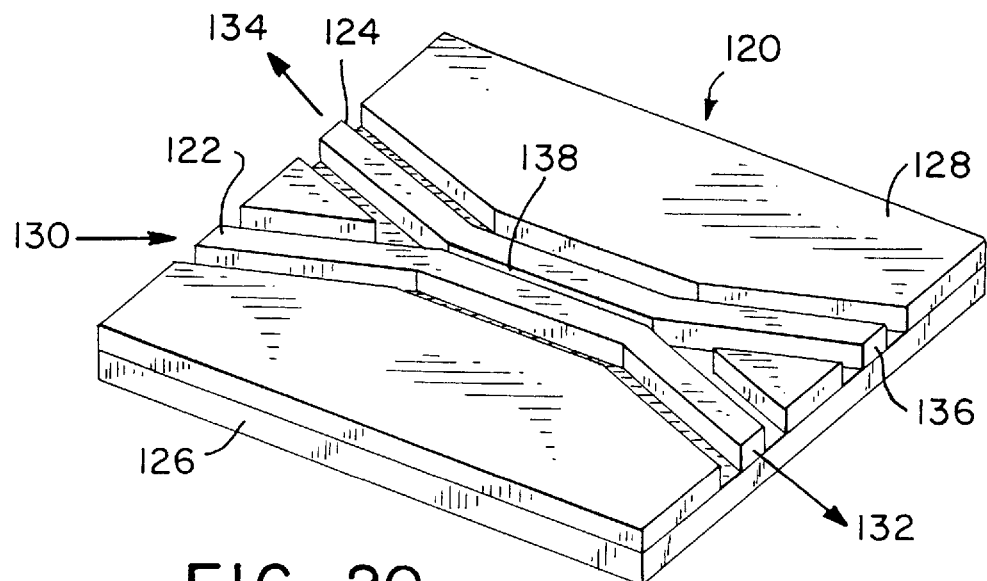
FIG. 20 is a simplified illustrative perspective view of a coupled-line coupler topology fabricated in accordance with the method of the present invention.

A coupled-line coupler topology 120 that may be fabricated in accordance with the method of the present invention is illustrated in FIG. 20. As shown, two thick metal conductors 122 and 124 are fabricated on a substrate 126 along with a ground plane 128. For this coupler topology 120, the substrate 126 is preferably GaAs. The conductors 122 and 124 are separated from the ground plane 128 by gaps. One end 130 of the first conductor 122 is a conductor input. The other end 132 of the first conductor 122 is the conductor through port. One end 134 of the second conductor 124 is the coupled port. The other end 136 of the second conductor 124 is the isolated port. A narrow gap 138 separates the first and second conductors 122 and 124 along a portion of the conductors' length to form a coupled-line section thereof. This coupled-line section will be preferably approximately one-quarter of the wavelength of the signal to be coupled in length.

Figure 21:
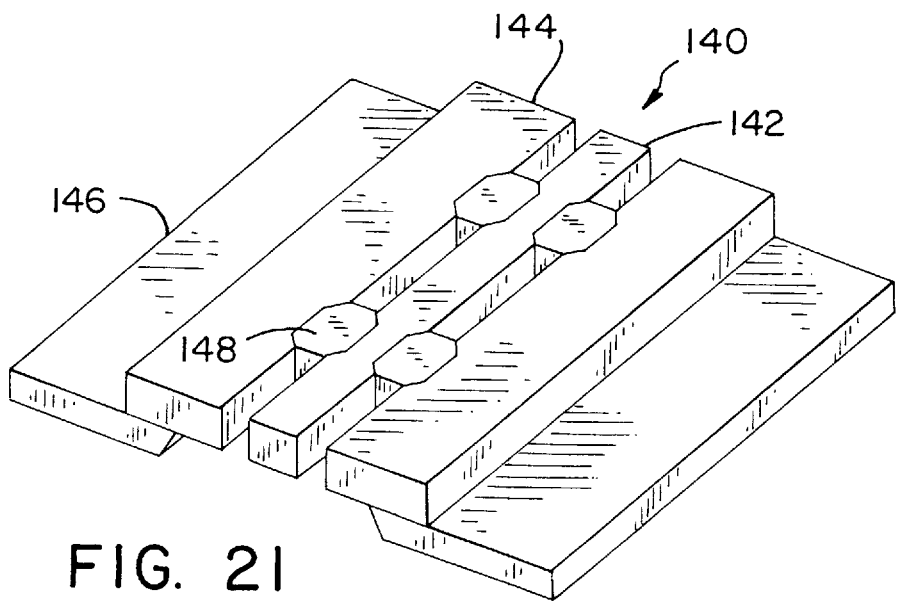
FIG. 21 is a simplified illustrative perspective view of a coplanar air dielectric transmission line topology fabricated in accordance with the method of the present invention.

An "air-dielectric" transmission line topology 140 that may be fabricated in accordance with the method of the present invention is illustrated in FIG. 21. The air-dielectric transmission line 140 includes a center conductor 142 separated from ground planes 144 located on each side of the center conductor 142. The air-dielectric transmission line 140 is formed on a dielectric substrate 146 in a manner similar to that used to fabricate the CPW transmission line 70 illustrated in FIG. 11, with the following modifications. In fabricating the transmission line 140 a cross-linked PMMA photoresist may preferably be used. After the center conductor 142 and ground planes 144 are formed by electroplating in accordance with the method of the present invention, the photoresist layer is exposed to radiation in a second pattern, and developed to remove all remaining photoresist from the substrate 146 except for selected portions 148 thereof located in the gaps between the center conductor 142 and ground plane conductors 144. A portion of the substrate 146 (and plating base) located beneath the center conductor 142 is then removed, such as by etching or in some other conventional manner. The center conductor 142 is thereby left suspended in air between the ground plane conductors 144 by the selected remaining portions 148 of the photoresist. The removal of part of the substrate 146 from beneath the center conductor 142 decreases the difference in the even and odd-mode phase velocities.

It should be noted that the method of the present invention for fabricating thick metal microstrip and CPW transmission lines and circuit topologies may be used to produce other circuit topologies, particularly circuit topologies requiring vertical sidewall structures and tight coupling, than those that have been illustrated herein. Examples of other circuit topologies that may be fabricated in thick metal using the fabrication method of the present invention include microstrip and CPW topology resonators and interdigital capacitors, planar couplers, planar lumped element series inductors and shunt capacitors, interdigital filters, patch antennas, etc. For each circuit topology to be fabricated, the fabrication process of the present invention as described is essentially the same. Individual circuit topologies are specified by the mask absorber pattern on the X-ray mask used during the fabrication process.

The present invention is thus not limited to particular applications or circuit topologies described herein, but embraces all such modified forms thereof as come within the scope of the following claims.

What is claimed is:

1. A method for fabricating thick metal transmission line circuits, comprising the steps of:
    (a) providing a substrate having a first surface and a second surface;
    (b) depositing a metal plating base layer on the first surface of the substrate;
    (c) depositing a metal ground plane layer on the second surface of the substrate wherein the second surface is parallel to the first surface;
    (d) applying a photoresist layer onto the plating base layer;
    (f) providing an X-ray mask having X-ray absorbers positioned thereon in a pattern defining a transmission line circuit topology;
    (f) exposing the photoresist layer to X-rays from an X-ray source through the X-ray mask to make a portion of the photoresist layer dissolvable in a pattern corresponding to the transmission line circuit topology;
    (g) developing the exposed photoresist layer to remove the dissolvable portions thereof and to expose the plating base layer in areas from which the photoresist layer is removed; and
    (h) electroplating a metal onto the plating base layer in the areas from which the photoresist layer has been removed to form the thick metal transmission line circuit.

2. The method of claim 1 wherein the X-ray mask absorber pattern defines a transmission line circuit topology including a microstrip transmission line.

3. A method for fabricating thick metal transmission line circuits, comprising the steps of:
    (a) providing a substrate having a first surface and a second surface which is parallel to the first surface;
    (b) depositing a metal plating base layer on the first surface of the substrate;
    (c) depositing a metal ground plane layer on the second surface of the substrate;
    (d) applying a photoresist layer onto the plating base layer;
    (e) providing an X-ray mask having X-ray absorbers positioned thereon in a pattern defining a transmission line circuit topology including a thick metal microstrip transmission line;
    (f) exposing the photoresist layer to X-rays from an X-ray source through the X-ray mask to make a portion of the photoresist layer dissolvable in a pattern corresponding to the transmission line circuit topology;
    (g) developing the exposed photoresist layer to remove the dissolvable portions thereof and to expose the plating base layer in areas from which the photoresist layer is removed; and
    (h) electroplating a metal onto the plating base layer in the areas from which the photoresist layer has been removed to form the thick metal transmission line circuit including the thick metal microstrip transmission line.

4. The method of claim 3 comprising additionally the step of forming a thin planar microstrip line on the first surface of the substrate and wherein the X-ray mask absorber pattern defines a transition between the thick metal microstrip transmission line and the thin planar microstrip line.

5. The method of claim 4 wherein the thin planar microstrip line includes a section of gradually decreasing width, and wherein the X-ray mask absorber pattern defines a transition section of gradually increasing width of the thick metal microstrip transmission line that is aligned with the section of gradually decreasing width of the thin planar microstrip line.

6. The method of claim 3 wherein the step of electroplating forms a thick metal microstrip transmission line between approximately 5 micrometers and 1 mm thick.

7. A method for fabricating thick metal transmission line circuits, comprising the steps of:

(a) providing a substrate having a first surface and a second surface which is parallel to the first surface;

(b) depositing a metal plating base layer on the first surface of the substrate;

(c) depositing a metal ground plane on the second surface of the substrate;

(d) applying a photoresist layer onto the plating base layer;

(e) providing an X-ray mask having X-ray absorbers positioned thereon in a pattern defining a transmission line circuit topology including a band-pass filter having a plurality of conductor sections that are separated from each other by gaps;

(f) exposing the photoresist layer to X-rays from an X-ray source through the X-ray mask to make a portion of the photoresist layer dissolvable in a pattern corresponding to the transmission line circuit topology;

(g) developing the exposed photoresist layer to remove the dissolvable portions thereof and to expose the plating base layer in areas from which the photoresist layer is removed; and (h) electroplating a metal onto the plating base layer in the areas from which the photoresist layer has been removed to form the thick metal transmission line circuit including metal conductor sections separated from each other by gaps to form the band-pass filter.

8. The method of claim 7 wherein the step of electroplating forms a band-pass filter between approximately 5 micrometers and 1 mm thick.

9. A method for fabricating thick metal transmission line circuits, comprising the steps of:

(a) providing a substrate having a first surface and a second surface which is parallel to the first surface;

(b) depositing a metal plating base layer on the first surface of the substrate;

(c) depositing a metal ground plane on the second surface of the substrate;

(d) applying a photoresist layer onto the plating base layer;

(e) providing an X-ray mask having X-ray absorbers positioned thereon in a pattern defining a transmission line circuit topology including a low-pass filter having alternating narrow and wide conductor sections;

(f) exposing the photoresist layer to X-rays from an X-ray source through the X-ray mask to make a portion of the photoresist layer dissolvable in a pattern corresponding to the transmission line circuit topology;

(g) developing the exposed photoresist layer to remove the dissolvable portions thereof and to expose the plating base layer in areas from which the photoresist layer is removed; and (h) electroplating a metal onto the plating base layer in the areas from which the photoresist layer has been removed to form the thick metal transmission line circuit including alternating narrow and wide metal conductor sections to form the low-pass filter.

10. The method of claim 9 wherein the step of electroplating forms a band-pass filter between approximately 5 micrometers and 1 mm thick.

* * * * *